(12) United States Patent
Ohgoh et al.

(10) Patent No.: US 6,856,636 B2
(45) Date of Patent: Feb. 15, 2005

(54) SEMICONDUCTOR LASER DEVICE

(75) Inventors: Tsuyoshi Ohgoh, Kaisei-machi (JP); Toshiaki Fukunaga, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/217,500

(22) Filed: Aug. 14, 2002

(65) Prior Publication Data

US 2003/0039289 A1 Feb. 27, 2003

(30) Foreign Application Priority Data

Aug. 27, 2001 (JP) ........................................ 2001-256234

(51) Int. Cl.$^7$ ................................................ H01S 5/00
(52) U.S. Cl. ........................................ 372/46; 372/45
(58) Field of Search ........................................ 372/45–46

(56) References Cited

U.S. PATENT DOCUMENTS

| | | | | |
|---|---|---|---|---|
| 6,400,743 | B1 * | 6/2002 | Fukunaga et al. | 372/46 |
| 6,546,033 | B2 * | 4/2003 | Fukunaga | 372/45 |
| 6,580,738 | B2 * | 6/2003 | Fukunaga | 372/46 |
| 6,600,770 | B2 * | 7/2003 | Fukunaga et al. | 372/45 |
| 6,621,845 | B2 * | 9/2003 | Fukunaga | 372/46 |
| 2001/0017871 | A1 * | 8/2001 | Fukunaga | 372/43 |
| 2002/0044584 | A1 * | 4/2002 | Fukunaga | 372/46 |

FOREIGN PATENT DOCUMENTS

| | | |
|---|---|---|
| EP | 1-104-057 | 5/2001 |
| JP | 2001-148541 | 5/2001 |
| JP | 2001-168458 | 6/2001 |

OTHER PUBLICATIONS

U.S. Appl. No. 09/731,702 filed Dec. 8, 2000.
IEEE Journal of Selected Topics in Quantum Electronics, vol. 1, No. 2, 1995, pp. 189.

* cited by examiner

*Primary Examiner*—Don Wong
*Assistant Examiner*—James Menefee
(74) *Attorney, Agent, or Firm*—Sughrue Mion, PLLC (57) ABSTRACT

An n-GaAs buffer layer, an n-$Al_{z1}Ga_{1-z1}As$ cladding layer, an n- or i-$In_{0.49}Ga_{0.51}P$ waveguide layer, an i-$In_{x3}Ga_{1-x3}As_{1-y3}P_{y3}$ barrier layer, a compressive strain $In_{x1}Ga_{1-x1}As_{1-y1}P_{y1}$ quantum well active layer, an i-$In_{x3}Ga_{1-x3}As_{1-y3}P_{y3}$ upper barrier layer, and an $In_{0.49}Ga_{0.51}P$ cap layer are laminated on an n-GaAs substrate. Regions near facets of the barrier layer to the cap layer are removed, and a p- or i-type $In_{0.49}Ga_{0.51}P$ upper optical waveguide layer is laminated on the cap layer to fill in the removed portions. A p-GaAs etching stop layer, an n-$In_{0.49}(Al_{z2}Ga_{1-z2})_{0.51}P$ current confinement layer having an opening, an n-$In_{0.49}Ga_{0.51}P$ second cap layer, a p-$In_{0.49}Ga_{0.51}P$ second upper optical waveguide layer 34 and a p-$Al_{z1}Ga_{1-z1}As$ upper cladding layer are laminated thereon, and a p-GaAs contact layer is formed inwardly except near the facets on the laminated surface, and an insulation film is formed on the regions near the facets, and a p-side electrode is provided as an uppermost layer.

12 Claims, 5 Drawing Sheets

SEMICONDUCTOR LASER DEVICE

BACKGROUND OF THE INVENTION

1. Field of the Invention

The present invention relates to a semiconductor laser device and more particularly to a semiconductor laser device comprising an InGaAsP active layer with compressive strain on a GaAs substrate.

2. Description of the Related Art

In "High-Power Highly-reliable Operation of 0.98-μm InGaAs—InGaP Strain-Compressed Single-Quantum-Well Lasers with Tensile-Strained InGaAsP Barriers.: IEEE Journal of Selected Topics in Quantum Electronics, Vol. 1, No. 2 (1995) pp. 189." (hereinafter referred to as document 1), as an all Al-free semiconductor laser device with a wavelength of 0.98 μm, there is reported a semiconductor laser device. This semiconductor laser device is provided with a current confinement layer and a refractive index waveguide mechanism and which oscillates in a fundamental transverse mode, wherein on an n-type GaAs substrate, laminated are an n-type InGaP cladding layer, an InGaAsP optical waveguide layer of an undoped type, a tensile-stained InGaAsP barrier layer, an InGaAs double quantum well active layer, a tensile-stained InGaAsP barrier layer, an InGaAsP optical waveguide layer of an undoped type, a p-type InGaP upper first cladding layer, a p-type GaAs optical waveguide layer, a p-type InGaP upper second cladding layer, a p-type GaAs cap layer and an insulation layer so as to form a narrow-striped ridge structure up to the upper portion of the p-type InGaP upper first cladding layer by selective etching with general photolithography, and both sides of the ridge structure are buried with n-type $In_{0.5}Ga_{0.5}P$ by selective MOCVD growth to remove the insulation layer so as to form a p-type GaAs contact layer.

However, in the semiconductor laser device reported in document 1, a characteristic temperature of a threshold current is as low as 156 K, causing difficulty in reducing costs since temperature adjustment is essential to practical use. The reason why the temperature characteristic of this semiconductor layer device is low is largely attributed to influence due to carrier overflow. The carrier overflow is a phenomenon in which density of carrier injection to the active layer is increased by high power and a high-temperature operation, so that the carrier overflows from the active layer area onto the optical waveguide layer and cladding layer area. Particularly, in the case of document 1, there has been a drawback in which the structure causes the carrier overflow easily since a band gap difference between the active layer and the optical waveguide layer is small.

In order to solve this problem, there has been proposed a semiconductor laser device using $In_{0.49}Ga_{0.51}P$ as an optical waveguide layer and an $Al_{z1}Ga_{1-z1}As$ cladding layer ($0.6 \leq z1 \leq 0.8$) as a cladding layer in Japanese Unexamined Patent Publication No. 2001-168458. The adoption of $In_{0.49}Ga_{0.51}P$ with a large band gap as an optical waveguide layer suppresses the leakage of carriers from the active layer and a value of a characteristic temperature $T_0$ reaches 300 K or more. Therefore, a large improvement in the temperature characteristic can be seen. Moreover, in the aforementioned publication, as an example that is applied to a single mode LD, there is disclosed the structure in which $In_{0.49}(Al_{z2}Ga_{1-z2})_{0.51}P$ ($0.15 \leq z2 \leq 1$) is used as a current confinement layer and this makes it possible to obtain a single mode LD with a good temperature characteristic. However, in $In_{0.49}(Al_{z2}Ga_{1-z2})_{0.51}P$ with high Al composition, there were problems such as deterioration in characteristics, a reduction in yields, etc., resulting from the fact that a good quality crystal was not easily obtained. Accordingly, the aforementioned semiconductor laser device still had room for improvement.

Meanwhile, in Japanese Unexamined Patent Publication No. 2001-148541, in order to improve noise characteristics of a semiconductor laser device, there is proposed a structure wherein in the semiconductor laser device using $In_{x1}Ga_{1-x1}As_{1-y1}P_{y1}$ as a quantum well active layer and $In_{0.49}Ga_{0.51}P$ as an optical waveguide layer, an $In_{0.49}Ga_{0.51}P$ upper first optical waveguide layer, a GaAs etching stop layer, an $In_{0.49}(Al_{z2}Ga_{1-z2})_{0.51}P$ current confinement layer, and a $In_{0.49}Ga_{0.51}P$ cap layer are laminated as a layer structure on the quantum well active layer, thereafter the $In_{0.49}Ga_{0.51}P$ cap layer of a stripe region where a current is injected, the $In_{0.49}(Al_{z2}Ga_{1-z2})_{0.51}P$ current confinement layer, and the GaAs etching stop layer are removed to expose the $In_{0.49}Ga_{0.51}P$ upper first optical waveguide layer, and two layers of an $In_{0.49}Ga_{0.51}P$ upper second optical waveguide layer and an $Al_{z1}Ga_{1-z1}As$ upper cladding layer ($0.57 \leq z1 \leq 0.8$) are laminated on the cap layer and the upper first optical waveguide layer.

The semiconductor laser device having the aforementioned structure has an advantage in that not only a noise characteristic is improved but also the Al composition of $In_{0.49}(Al_{z2}Ga_{1-z2})_{0.51}P$, which is the current confinement layer, can be reduced as compared with the semiconductor laser device disclosed in the above-mentioned Japanese Unexamined Patent Publication No. 2001-168458. However, there was still more room for improvement in the suppression of catastrophic optical damage (COD) under a high power drive condition even with the exception of the problem resulting from the high Al composition.

SUMMARY OF THE INVENTION

In consideration of the aforementioned problem, it is an object of the present invention to provide a semiconductor laser device, which suppresses occurrence of COD and which is excellent in reliability under a high power drive condition, in a semiconductor laser device comprising an $In_{x1}Ga_{1-x1}As_{1-y1}P_{y1}$ active layer with compressive strain, and a method for manufacturing the same.

According to a first aspect of the present invention, there is provided a semiconductor laser device comprising: a GaAs substrate of a first conductive type; a lower cladding layer of the first conductive type, the lower cladding layer being formed on the GaAs substrate; a lower optical waveguide layer of the first conductive type or an undoped type made of InGaP, the lower optical waveguide layer being lattice-matched with the GaAs substrate and formed on the lower cladding layer; an active layer made of $In_{x1}Ga_{1-x1}As_{1-y1}P_{y1}$ with compressive strain where $0<x1 \leq 0.4$ and $0 \leq y1 \leq 0.1$, the active layer being formed on the lower optical waveguide layer; an upper first optical waveguide layer of a second conductive type or an undoped type made of InGaP, the upper first optical waveguide layer being lattice-matched with the GaAs substrate and formed on the active layer; a current confinement layer of a first conductive type made of $In_{0.49}(Al_{z2}Ga_{1-z2})_{0.51}P$, the current confinement layer having an opening serving as a current passage and being formed on the upper first optical waveguide layer; an upper second optical waveguide layer of the second conductive type formed so as to bury the opening, the upper second optical waveguide layer being formed on the current confinement layer; an upper cladding layer of the second conductive type, the upper cladding layer being formed on the upper second optical waveguide layer; a GaAs contact layer of the second conductive type, the GaAs contact layer being formed on the upper cladding layer; an electrode formed on the GaAs contact layer; and resonator facets formed of two opposite facets, wherein a current injection control structure that controls a current injection to the active layer is provided in the vicinity of at least one of the facets.

"One electrode" indicates one of a pair of electrodes that the semiconductor laser device generally includes.

The current injection control structure may be formed by providing the GaAs contact layer to extend inwardly from a position away from the one facet by 5 $\mu$m or more. Alternatively, the current injection control structure may be formed by providing the GaAs contact layer to extend inwardly from a position away from the one facet by 5 $\mu$m or more, providing the electrode having a portion on the contact layer, the portion projecting to the facet from the contact layer, and providing an insulation layer between the projected portion of the electrode and the cladding layer of the second conductive type.

Note that, though the current injection control structure may be formed on at least one of the resonator facets, it is preferably formed on both faces.

Moreover, it is preferable that the active layer is laminated only inwardly from a position away from at least one of the facets by a predetermined distance and that a layer which has a band gap larger than that of the active layer, the layer being equivalent to the upper first optical waveguide layer, is laminated on a region ranging from an end edge away from the facet of the active layer to the facet. In other words, provision of the so-called window structure wherein a region where no active layer exists in the portion in the vicinity of at least one facet of the resonator facets and this region is buried with the layer equivalent to the upper first optical waveguide layer is preferable.

Though the window structure may be formed on at least one of the resonator facets, it is preferably formed on both faces.

Hereinafter, "a layer, which is equivalent to the upper first optical waveguide layer" means a layer, which is made of InGaP and which is lattice-matched with the GaAs substrate, similar to the upper first optical waveguide layer.

According to a second aspect of the present invention, there is provided a semiconductor laser device comprising: a GaAs substrate of a first conductive type; a lower cladding layer of the first conductive type, the lower cladding layer being formed on the GaAs substrate; a lower optical waveguide layer of the first conductive type or an undoped type made of InGaP, the lower optical waveguide layer being lattice-matched with the GaAs substrate and formed on the lower cladding layer; an active layer made of $In_{x1}Ga_{1-x1}As_{1-y1}P_{y1}$ with compressive strain where $0 < x1 \leq 0.4$ and $0 < y1 < 0.1$, the active layer being formed on the lower optical waveguide layer; an upper first optical waveguide layer of a second conductive type or an undoped type made of InGaP, the upper first optical waveguide layer being lattice-matched with the GaAs substrate and formed on the active layer; a current confinement layer made of $In_{0.49}(Al_{z2}Ga_{1-z2})_{0.51}P$ of a first conductive type, the current confinement layer having an opening serving as a current passage and being formed on the upper first optical waveguide layer; an upper second optical waveguide layer of the second conductive type formed so as to bury the opening, the upper second optical waveguide layer being formed on the current confinement layer; an upper cladding layer of the second conductive type, the upper cladding layer being formed on the upper second optical waveguide layer; a GaAs contact layer of the second conductive type, the GaAs contact layer being formed on the upper cladding layer; an electrode formed on the GaAs contact layer; and resonator facets formed of two opposite facets, wherein the active layer is laminated only inwardly from a position away from at least one of the facets by a predetermined distance, and a layer which has a band gap larger than that of the active layer, the layer being equivalent to the upper first optical waveguide layer, is laminated on a region ranging from an end edge away from the facet of the active layer to the facet.

Namely, the feature of the semiconductor laser device of the present invention lies in the provision of the so-called window structure wherein a region where no active layer exists in the portion in the vicinity of at least one facet of the resonator facets in the semiconductor laser device having the above-described layer structure and this region is buried with the layer equivalent to the upper first optical waveguide layer. Though this window structure may be formed on at least one of the resonator facets, it is preferably formed on both faces.

In the semiconductor laser, each of the cladding layers is preferably made of any one of $Al_{z1}Ga_{1-z1}As$ where $0.57 \leq z1 \leq 0.8$ and $In_{0.49}(Ga_{1-z4}Al_{z4})_{0.51}P$ where $0.1 \leq z4 \leq 0.5$.

The upper second optical waveguide layer of the second conductive type is preferably made of any one of InGaP and AlGaAs having a refractive index equivalent to that of the InGaP, which are lattice-matched with the GaAs substrate.

The semiconductor laser devices according to the present invention may comprise barrier layers with a thickness of 10 nm or less made of $In_{x3}Ga_{1-x3}As_{1-y3}P_{y3}$ where $0 \leq x3 \leq 0.3$ and $0.1 \leq y3 \leq 0.6$, the barrier layers being severally formed between the active layer and the lower optical waveguide layer and between the active layer and the upper first optical waveguide layer and having band gaps larger than that of the active layer.

Moreover, the semiconductor laser devices according to the present invention may comprise a strain compensation layer made of $In_{x2}Ga_{1-x2}As_{1-y2}P_{y2}$ where $0 \leq x2 \leq 0.49y2$ and $0 < y2 \leq 0.5$, the strain compensation layer being formed between the active layer and the barrier layer, and having tensile strain stress.

An oscillation peak wavelength is preferably in a range from 900 to 1200 nm.

When a width of the current passage is 1.5 $\mu$m or more and less than 4 $\mu$m, a refractive index step difference is preferably in a range from $1.5 \times 10^{-3}$ to $7.0 \times 10^{-3}$.

When a width of the current passage is 4 $\mu$m or more, a refractive index step difference is preferably $1.5 \times 10^{-3}$ or more.

Regarding the equivalent refractive index step difference, in the case of the device including the internal current confinement structure as in the semiconductor laser device of the present invention, the equivalent refractive index step difference $\Delta n$ is defined by nb-na, where na is an equivalent refractive index with an oscillation wavelength in the lamination direction of the region where the current confinement layer exists and nb is an equivalent refractive index with an oscillation wavelength in the lamination direction at the current passage.

The semiconductor laser device according to the first aspect of the present invention has the current injection control structure so as to control the current injection to the facets with numerous surface levels, making it possible to restrain occurrence of nonluminous recombination on the surface and to suppress occurrence of COD.

Moreover, the semiconductor laser device according to the second aspect of the present invention has the so-called window structure in which a region where no active layer exists in the portion in the vicinity of at least one facet of the resonator facets and this region is buried with the layer equivalent to the upper first optical waveguide layer having a band gap larger than that of the active layer. The provision of this window structure makes it possible to control absorption of a laser beam in the vicinity of the facet and to suppress occurrence of COD so as to obtain high reliability even at high power oscillation.

The semiconductor laser device having the above-mentioned current injection control structure and window structure concurrently can greatly suppress the current injection to the window region and further realize an increase in optical output power.

Moreover, since the first conductive type or undoped InGaP, which is lattice-matched with the GaAs substrate, is used as a lower optical waveguide layer and an upper first optical waveguide layer, a band gap difference between the active layer and the optical waveguide layer can be largely taken so as to obtain a semiconductor laser device with a good temperature characteristic that suppresses the leakage of carriers from the active layer.

Still moreover, the use of InGaP as an optical waveguide layer can obtain manufacturing advantages that control of etching depth upon forming the window structure is made easy and regrowth is made easy since a regrowth interface becomes a P (phosphorus) surface, etc.

Still moreover, the semiconductor laser devices according to the third and second aspects of the present invention are structured to have the upper second optical waveguide layer buried in the opening of the current confinement layer and the upper cladding layer formed thereon. In such a manner described above, a layer to be used as a regrowth layer is formed into a two-layered structure, so that the Al composition ratio of the $In_{0.49}(Al_{z2}Ga_{1-z2})_{0.51}P$ current confinement layer can be controlled low. The control of Al composition makes it possible to solve the problem resulting from the high Al composition.

DESCRIPTION OF THE PREFERRED EMBODIMENTS

Embodiments of the present invention are explained in detail using FIGS. 1 to 4. FIGS. 1A, 2A, 3A, and 4A are sectional side views cut at a surface including an active region, FIGS. 1B, 2B, 3B, and 4B are cross-sectional views taken along lines 1B—1B, 2B—2B, 3B—3B, and 4B—4B, respectively (the cross-sectional view in the vicinity of an facet of the semiconductor laser device in the direction perpendicular to the resonance direction thereof), and FIGS. 1C, 2C, 3C, and 4C are cross-sectional views taken along lines 1C—1C, 2C—2C, 3C—3C, and 4C—4C, respectively (the central portion of the semiconductor laser device in the direction perpendicular to a resonance direction thereof).

Figure 1A:
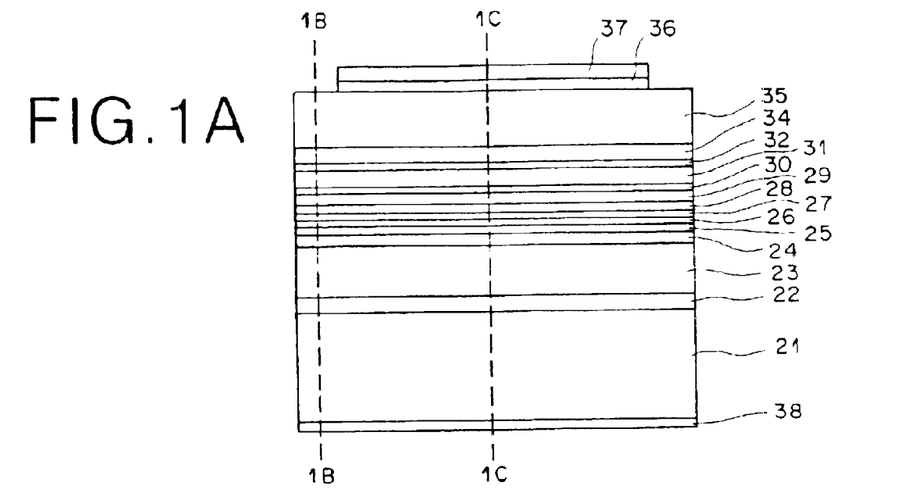
FIG. 1A is a cross-sectional view of a semiconductor laser device according to the first embodiment of the present invention.
Figure 1B:
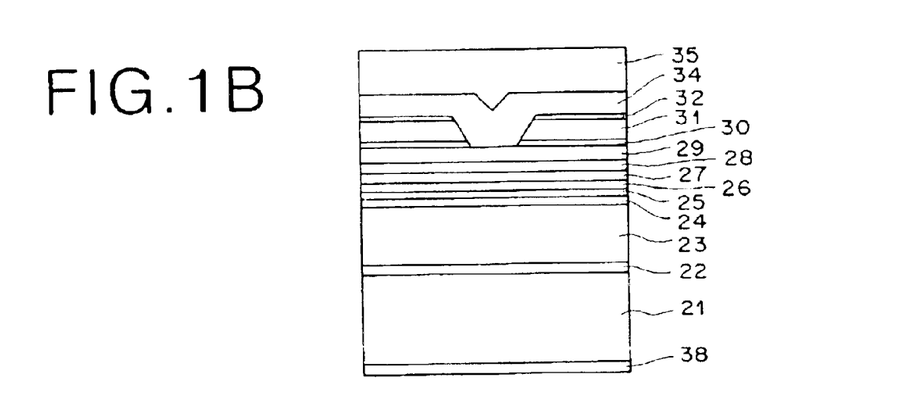
FIG. 1B is a cross sectional view of the semiconductor laser device shown in FIG. 1A, taken along the line 1B—1B.
Figure 1C:
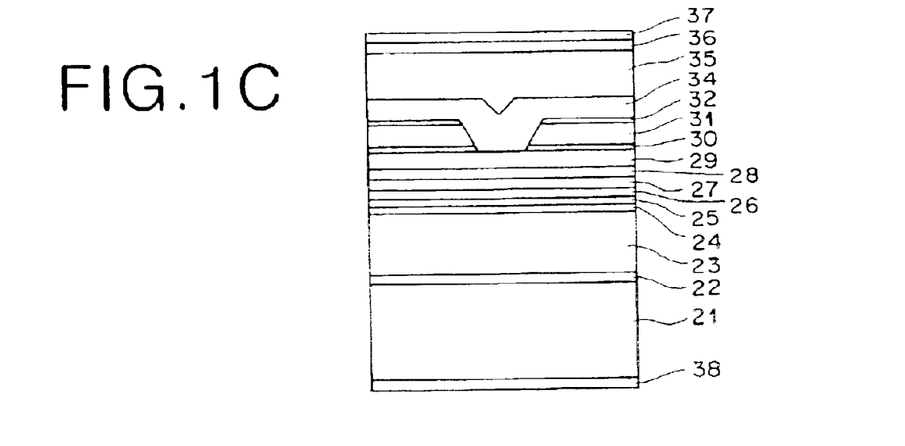
FIG. 1C is a cross sectional view of the semiconductor laser device shown in FIG. 1A, taken along the line 1C—1C.

The first embodiment of the present invention is shown in FIGS. 1A, 1B, and 1C. The present semiconductor laser device comprises an n-type GaAs buffer layer 22, an n-type $Al_{z1}Ga_{1-z1}$. As lower cladding layer 23 ($0.57 \leq z1 \leq 0.8$), an n-or i-type $In_{0.49}Ga_{0.51}P$ lower optical waveguide layer 24, an i-type $In_{x3}Ga_{1-x3}As_{1-y3}P_{y3}$ lower barrier layer 25 ($0 \times 3 \leq 0.3$, $0.1 \leq y3 \leq 0.6$), a compressive strain $In_{x1}Ga_{1-x3}As_{1y3}P_{y3}$ quantum well active layer 26 ($0<x1 \leq 0.4$, $0 \leq y1 \leq 0.1$), an i-type $In_{x3}Ga_{1-x3}As_{1-y3}P_{y3}$ upper barrier layer 27 ($0 \leq 3 \leq 0.3$, $0.1 \leq y3 \leq 0.6$), an $In_{0.49}Ga_{0.51}P$ first cap layer 28, a p- or i-type $In_{0.49}Ga_{0.51}P$ upper first optical waveguide layer 29, a p-type GaAs etching stop layer 30 having an opening serving as a current passage (thickness of about 10 nm), an n-type $In_{0.49}(Al_{z2}Ga_{1-z2})_{0.51}P$ current confinement layer 31 with an opening serving as a current passage, an n-type $In_{0.49}Ga_{0.51}P$ second cap layer 32 with an opening serving as a current passage (thickness of about 10 nm) a p-type $In_{0.49}Ga_{0.51}P$ upper second optical waveguide layer 34 formed to fill the opening, a p-type $Al_{z1}Ga_{1-z1}As$ upper cladding layer 35 ($0.57 \leq z1 \leq 0.8$), and a p-type GaAs contact layer 36, those which are formed on an n-type GaAs substrate 21 sequentially, and further a p-side electrode 37 on the contact layer 36, and an n-side electrode 38 on a face opposite with the semiconductor laminated surface of the substrate 21.

In the present semiconductor laser device, the contact layer 36 and the p-side electrode 37 formed on the upper surface of the contact layer 36 are not formed in a region which is up to about 20 μm inwardly from an facet of a resonator (a portion in the vicinity of the facet). In this way, the contact layer 36 and the electrode 37 are structured not to be formed on the portion in the vicinity of the facet, so that the current injection to the portion in the vicinity of the facet is suppressed, making it possible to restrain occurrence of nonluminous recombination and to suppress occurrence of COD on the facet. Note that the electrode 37 may not always have the same size as that of the contact layer 36, and may be extended toward the facet from the contact layer 36.

Figure 2A:
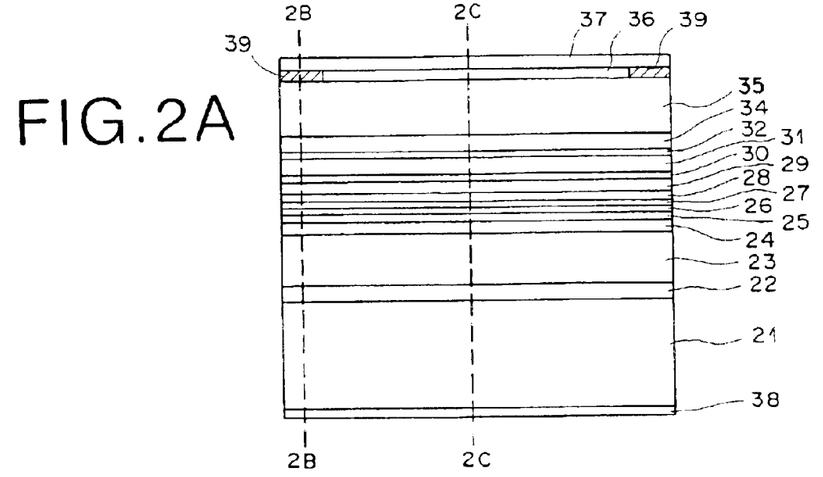
FIG. 2A is a cross-sectional view of a semiconductor laser device according to the second embodiment of the present invention.
Figure 2B:
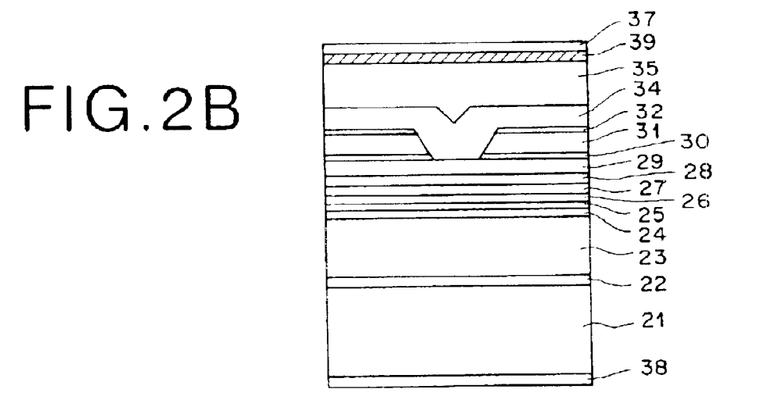
FIG. 2B is a cross sectional view of the semiconductor laser device shown in FIG. 2A, taken along the line 2B—2B.
Figure 2C:
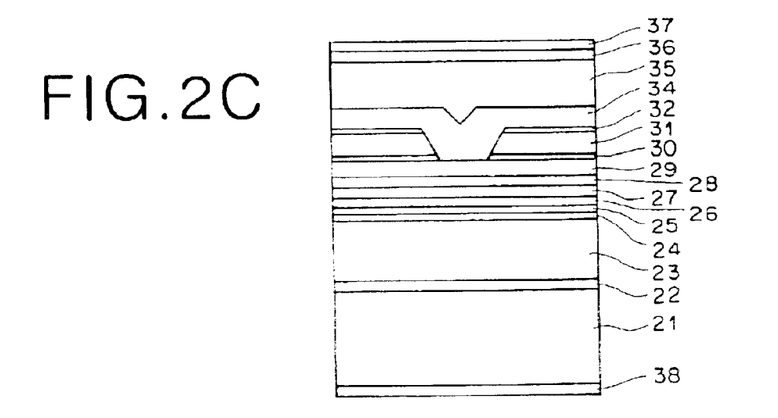
FIG. 2C is a cross sectional view of the semiconductor laser device shown in FIG. 2A, taken along the line 2C—2C.

The second embodiment of the present invention is shown in FIGS. 2A, 2B, and 2C. The present semiconductor laser device has substantially the same layer structure as that of the first embodiment, but it is different from the first embodiment in the point that an insulation film 39 is formed on the portion which is on the upper surface of the upper cladding layer 35 and which is the portion in the vicinity of the facet where no contact layer 36 is formed and the point that the p-side electrode 37 is formed on the contact layer 36 and insulation film 39. Similar to the above-mentioned case, this case can obtain an effect that controls the current injection to the portion in the vicinity of the facet so as to suppress occurrence of nonluminous recombination on the facet.

Figure 3A:
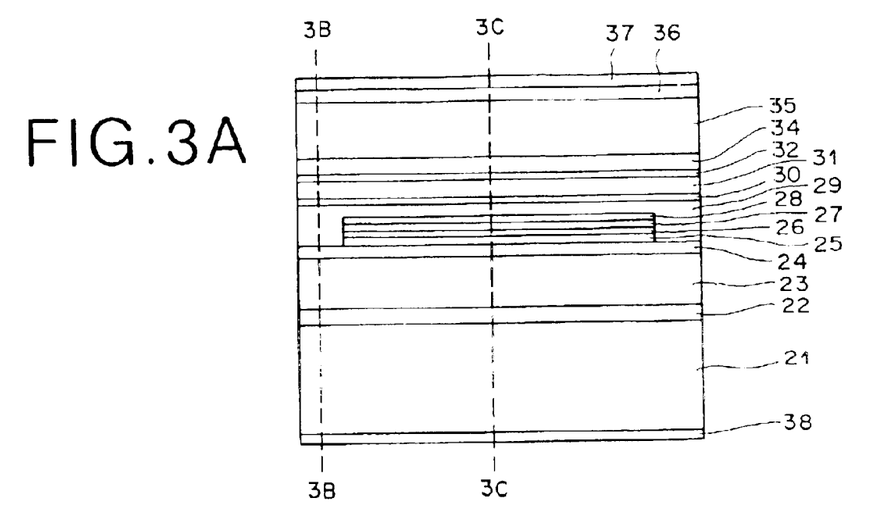
FIG. 3A is a cross-sectional view of a semiconductor laser device according to the third embodiment of the present invention.
Figure 3B:
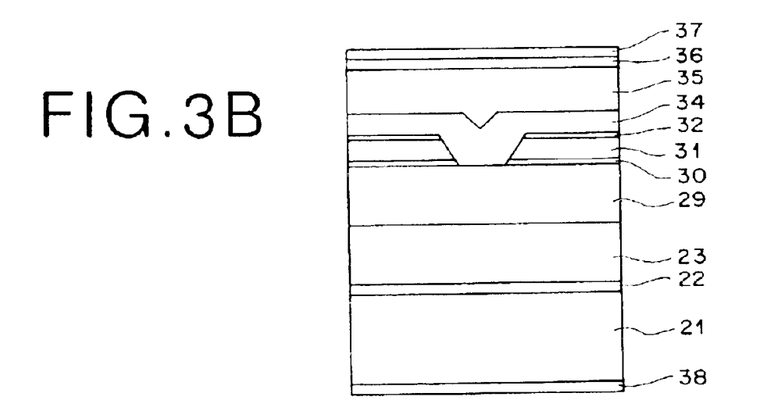
FIG. 3B is a cross sectional view of the semiconductor laser device shown in FIG. 3A, taken along the line 3B—3B.
Figure 3C:
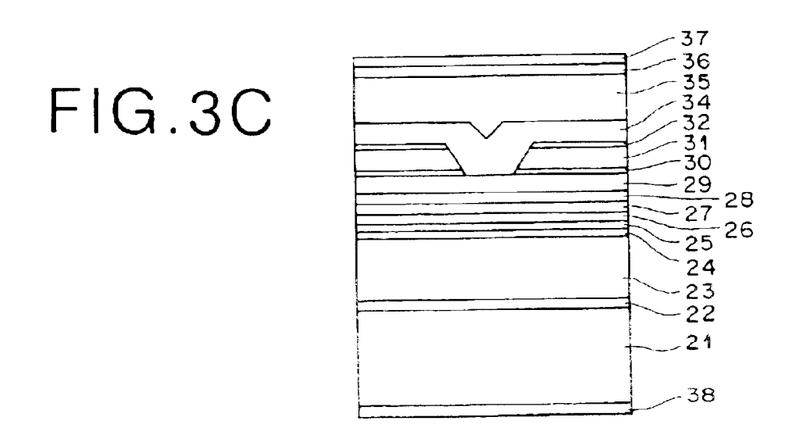
FIG. 3C is a cross sectional view of the semiconductor laser device shown in FIG. 3A, taken along the line 3C—3C.

The third embodiment of the present invention is shown in FIGS. 3A, 3B, and 3C. The present semiconductor laser device has substantially the same layer structure as that of the first embodiment, but it is different from the first embodiment in the point that the layers including the lower barrier layer 25 to the first cap layer 28 are formed only inwardly from the position away from the facets of the resonator by a predetermined distance and the upper first optical waveguide layer is buried in the portion in the vicinity of the facet, which is from the edge portions of these layers to the facet of the resonator and the point that the contact layer 36 is formed on the entire surface of the upper cladding layer 35, and the p-side electrode 37 of the contact layer 36 is also formed on the entire surface of the laminated surface.

Even if the contact layer 36 and the p-side electrode 37 are structured to be formed on the entire surface of the laminated surface, by providing the so-called window structure in which the portions of the lower barrier layer 25 to the first cap layer 28 in the vicinity of the facets are removed and an optical waveguide layer with a band gap larger than that of the active layer fills in the removed portions, it is possible to control absorption of a laser beam in the vicinity of the end portion and to suppress occurrence of COD.

An explanation will be given next of the specific manufacturing method for the semiconductor laser device according to the third embodiment. First, an n-type GaAs buffer layer 22, an n-type $Al_{z1}Ga_{1-z1}As$ lower cladding layer 23 ($0.57 \leq z1 \leq 0.8$), an n- or i-type $In_{0.49}Ga_{0.51}P$ lower optical waveguide layer 24, an i-type $In_{x3}Ga_{1-x3}As_{1-y3}P_{y3}$ lower barrier layer 25 ($0 \leq x3 \leq 0.3$, $0.1 \leq y3 \leq 0.6$), a compressive strain $In_{x1}Ga_{1-x1}As_{1-y1}P_{y1}$ quantum well active layer 26 ($0 < x1 \leq 0.4$, $0 \leq y1 \leq 0.1$), an i-type $In_{x3}Ga_{1-x3}As_{1-y3}P_{y3}$ upper barrier layer 27 ($0 \leq x3 \leq 0.3$, $0.1 \leq y3 \leq 0.6$), and an $In_{0.49}Ga_{0.51}P$ first cap layer 28 are laminated on an n-type GaAs substrate 221 in this order by an organometallic vapor phase growth method. The first cap layer 28 is coated with resist. With general photolithography, the resist on the strip-shaped portions having a width of about 40 μm at an interval of a predetermined resonator length, which extend in a direction expressed by the following formula.

[Formula 1]<0$\bar{1}$1>

The $In_{0.49}Ga_{0.51}P$ first cap layer 28 is etched by hydrochloric acid etchant using this resist as a mask, so as to expose the i-type $In_{x3}Ga_{1-x3}As_{1-y3}P_{y3}$ upper barrier layer 27. At this time, since the hydrochloric acid etchant is used, etching is automatically stopped at the upper surface of the i-type $In_{x3}Ga_{1-x3}As_{1-y3}P_{y3}$ upper barrier layer 27. Subsequently, the resist is removed, and etching is performed by use of sulfuric acid etchant until the $In_{0.49}Ga_{0.51}P$ lower optical waveguide layer 24 is exposed. The etching is automatically stopped at the upper surface of the $In_{0.49}Ga_{0.51}P$ lower optical waveguide layer 24. In such a manner described above, the stripe-shaped portions (the portions in the vicinity of the facet) of the active layer 26, the lower and upper barrier layers 25 and 27 and the first cap layer 28, which have a width of 40 μm and which include a setting position of a resonator facet, are removed.

Subsequently, a p- or i-type $In_{0.49}Ga_{0.51}P$ upper first optical waveguide layer 29 is grown so as to bury the removed portions in the vicinity of the facet. Subsequently, there are formed a p-type GaAs etching stop layer 30 (thickness of about 10 nm), an n-type $In_{0.49}(Al_{z2}Ga_{1-z2})_{0.51}P$ current confinement layer 31, an n-type $In_{0.49}Ga_{0.51}P$ second cap layer 32 (thickness of about 10 nm) and an n-type GaAs third cap layer (thickness of about 10 nm) (not shown). Thereafter, the third cap layer is coated with resist. Then, the resist on stripe-shaped regions, which correspond to a current injection opening having a width of about 1 μm to 3 μm, is removed in a <011>direction perpendicular to the stripe-shaped portions already removed. Stripe-shaped portions of the n-type GaAs third cap layer exposed to the opening of the resist, which correspond to the current injection opening, are removed by sulfuric acid etchant using the resist as a mask. At this time, the etching is automatically stopped at the upper surface of the n-type $In_{0.49}Ga_{0.51}P$ second cap layer 32. Thereafter, the resist is removed, stripe-shaped portions of the n-type $In_{0.49}Ga_{0.51}P$ second cap layer 32 exposed to the opening of the third cap layer are removed by hydrochloric acid etchant using the n-type GaAs third cap layer as a mask, and sequentially the strip-shaped portions of the n-type $In_{0.49}(Al_{z2}Ga_{1-z2})_{0.51}P$ current confinement layer 31 are removed so as to form a current injection opening. At this time, the etching is automatically stopped at the n-type GaAs etching stop layer 30. Moreover, the n-type GaAs etching stop layer 30 exposed to the opening portion is removed by sulfuric acid etchant and the residual n-type GaAs third cap layer is removed.

Subsequently, a p-type $In_{0.49}Ga_{0.51}P$ upper second optical waveguide layer 34, a p-type $Al_{z1}Ga_{1-z1}As$ upper cladding layer 35 ($0.57 \leq z1 \leq 0.8$) and a p-type GaAs contact layer 36 are formed. Thereafter, a p-side electrode 37 is formed on the contact layer 36, the substrate 21 is polished, and an n-side electrode 38 is formed on the polished surface.

Thereafter, a high reflectance coating is provided on one of the resonator surfaces formed by cleaving a sample at a position where the resonator facet is set, and a low reflectance coating is provided on the other resonator surface thereof. Then, the above construction is formed into a chip, thus completing the semiconductor laser device.

Here the thickness of the p-type $In_{0.49}Ga_{0.51}P$ upper second optical waveguide layer 34 and the composition and thickness of the n-type $In_{0.49}(Al_{z2}Ga_{1-z2})_{0.51}P$ current confinement layer 31 are set in a condition that a fundamental transverse mode oscillation can be maintained up to high power, specifically, an equivalent refractive index step difference between the stripe shaped regions and the current confinement layer region is in a range from $1.5 \times 10^{-3}$ to $7.0 \times 10^{-3}$.

Additionally, in order to compensate for the stress of the compressive strained active layer, an $In_{x2}Ga_{1-x2}As_{1-y2}P_{y2}$ strain compensation layer ($0 \leq x2 < 0.49y2$, $0 < y2 \leq 0.5$), which has a band gap larger than that of the active layer and which has tensile strain stress, may be formed between the active layer and the barrier layer. In this case, the sum of the product of the strain quantity and the thickness of the compressive strain active layer and the product of the strain quantity and the thickness of the tensile strain compensation layer is set to be within 0.3 nm.

Regarding the conductivities of the GaAs etching stop layer 30, $In_{0.49}Ga_{0.51}P$ second cap layer 32 and GaAs third cap layer, either of n-type or p-type may be used.

Note that, though this embodiment uses $In_{0.49}Ga_{0.51}P$ as upper second optical waveguide layer 34, the same effect can be obtained if $Al_{z3}Ga_{1-z3}As$ ($0.50 \leq z3 \leq 0.54$) having substantially the same refractive index as that of $In_{0.49}Ga_{0.51}P$ is used.

Figure 4A:
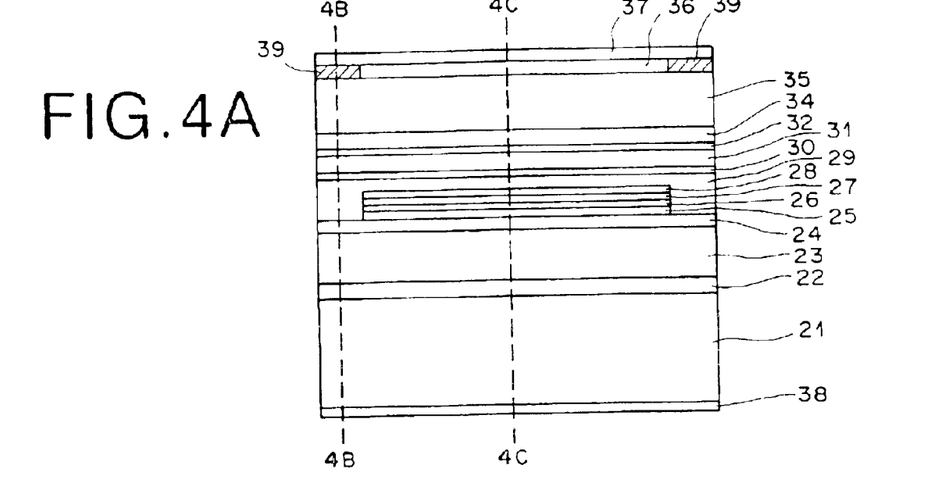
FIG. 4A is a cross-sectional view of a semiconductor laser device according to the fourth embodiment of the present invention.
Figure 4B:
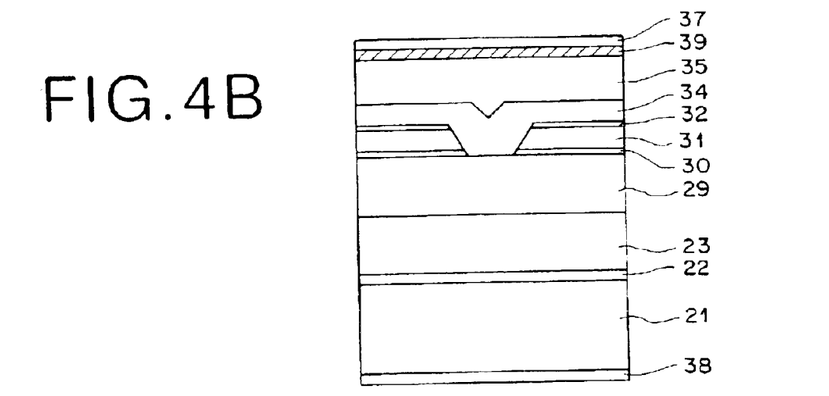
FIG. 4B is a cross sectional view of the semiconductor laser device shown in FIG. 4A, taken along the line 4B—4B.
Figure 4C:
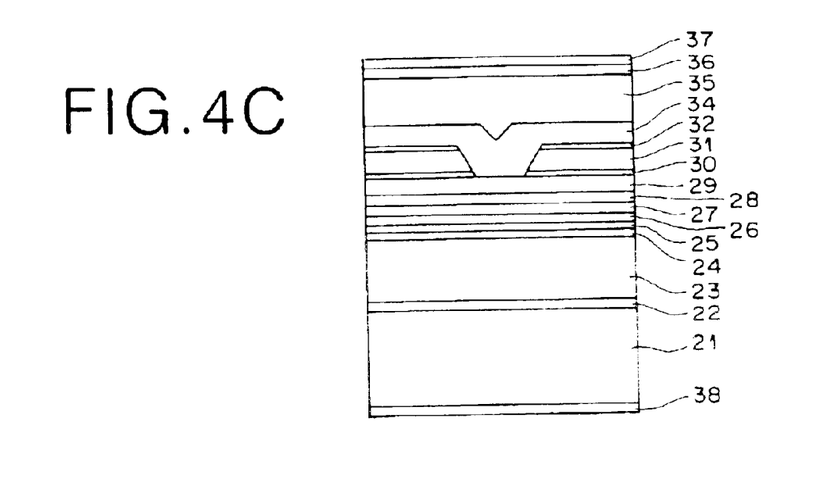
FIG. 4C is a cross sectional view of the semiconductor laser device shown in FIG. 4A, taken along the line 4C—4C.
Figure 5:
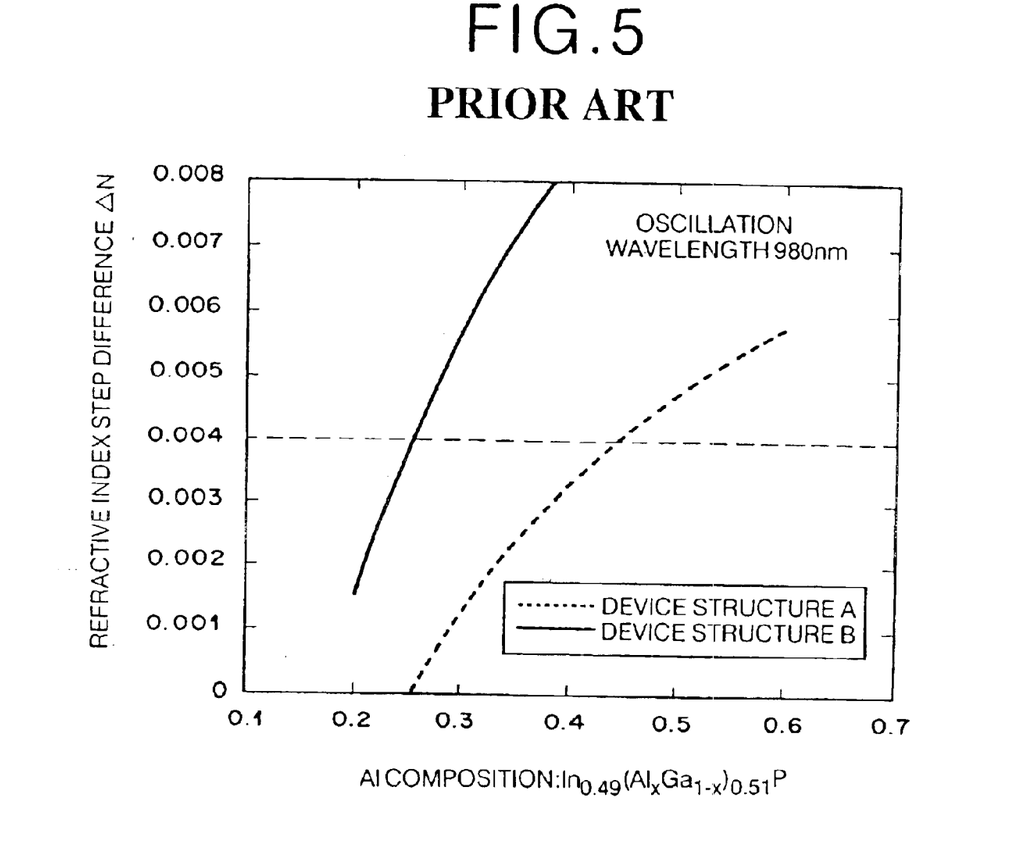
FIG. 5 is a view explaining the prior art.

The fourth embodiment of the present invention is shown in FIGS. 4A, 4B, and 4C. As illustrated in FIG. 4, the semiconductor laser device of this embodiment is one that has the structure in which the facet current injection control structure of the second embodiment and the window structure of the third embodiment are combined and that has higher reliability in which a current injection to a window region is greatly suppressed so as to increase a window effect.

An explanation will be given of the manufacturing method of the present semiconductor laser device. After forming the layers up to the p-type GaAs contact layer 36 by the same method as that of the manufacturing method of the third embodiment, the p-type GaAs contact layer 36 of the stripe-shaped region in the vicinity of the facet, which corresponds to the region where the active layer is removed, is eliminated. The removed portion is covered with an insulation film 39. Thereafter, a p-side electrode 37 is formed thereon, and the substrate 221 is polished so as to form an n-side electrode 38 on the polished surface. Thereafter, a high reflectance coating and a low reflectance coating are provided on the resonator surfaces formed by cleaving a sample, and then the above construction is formed into a chip, thus completing the semiconductor laser device.

Here, as a combination of the facet current injection control structure and the window structure, the structure having the facet current injection control structure of the first embodiment may be used. For forming such a device, there may be used a method in which the p-type GaAs contact layer 36 of the stripe region corresponding to the region where the active layer is removed is eliminated, thereafter the p-side electrode 37 is formed thereon along the p-type GaAs contact layer 36.

In addition, as shown in FIG. 4, the facet current injection control structure may be provided onto both low reflectance coating side and high reflectance coating side or only one of the low reflectance coating side and high reflectance coating side. Moreover, even if the window structure is formed on only one facet, a constant effect that suppresses COD can be obtained.

In semiconductor laser devices from the first to fourth embodiments described above, $In_{0.49}(Ga_{1-z4}Al_{z4})_{0.51}P$ layers ($0.1 \leq z4 \leq z2$) may be used as lower and upper cladding layers.

Furthermore, the quantum well in the active layer was a single layer in the aforementioned embodiments. However, there may be used a structure having a multiple quantum well in which quantum wells are laminated in a multilayer manner. In the case of the multiple quantum well structure, there may be used a structure in which a layer, which is made of the same material as that of the optical waveguide layer or the barrier layer, is interposed between the respective quantum well layers.

Additionally, the above explained the manufacturing method of the semiconductor laser device that provided a fundamental transverse mode oscillation. However, there may be used a refractive index waveguide type semiconductor laser device, which has a stripe width of 4 $\mu$m or more and which provides a multimode oscillation. Regarding the semiconductor laser device having a stripe width of 4 $\mu$m or more, its equivalent refractive index step difference $\Delta N$ is set to $2 \times 10^{-3}$ or more. The above-structured semiconductor laser device with the wide stripe has a low noise characteristic and can be used as a semiconductor laser device with high power required for solid laser excitation and the like.

Note that the semiconductor laser device structure of the present invention can be used in fabricating not only the semiconductor laser devices with a refractive index waveguide mechanism but also the semiconductor laser devices having a diffraction lattice, or optical integrated circuits.

Moreover, in the fabrication of each semiconductor laser device, molecular beam epitaxy using solid or gas raw material may be used as growth of each semiconductor layer.

In the above-mentioned embodiments, the GaAs substrate with n-type conductivity was described. However, a GaAs substrate with p-type conductivity may be also employed. In this case, all conductivities of layers may be changed to be opposite to those of the layers used in the semiconductor laser devices in the above-described embodiments.

Still moreover, the composition ratio of the $In_{x1}Ga_{1-x1}As_{1-y1}P_{y1}$ active layer is controlled in a range of $0 < x1 \leq 0.4$, $0 \leq y1 \leq 0.1$, making it possible to complete a semiconductor laser device having a peak oscillation wavelength in a range of $900 < \lambda < 1200$ (nm).

What is claimed is:

1. A semiconductor laser device comprising:
   a GaAs substrate of a first conductive type;
   a lower cladding layer of said first conductive type, the lower cladding layer being formed on said GaAs substrate;
   a lower optical waveguide layer of said first conductive type or an undoped type made of InGaP, the lower optical waveguide layer being lattice-matched with said GaAs substrate and formed on said lower cladding layer;
   an active layer made of $In_{x1}Ga_{1-x1}As_{1-y1}P_{y1}$ with compressive strain where $0 < x1 \leq 0.4$ and $0 \leq y1 \leq 0.1$, the active layer being formed on said lower optical waveguide layer;
   an upper first optical waveguide layer of a second conductive type or an undoped type made of InGaP, the upper first optical waveguide layer being lattice-matched with said GaAs substrate and formed on said active layer;
   a current confinement layer of a first conductive type made of $In_{0.49}(Al_{z2}Ga_{1-z2})_{0.51}P$, where $0.15 \leq z2 \leq 1$, the current confinement layer having an opening serving as a current passage and being formed on said upper first optical waveguide layer, wherein an equivalent refractive index step difference between the opening serving as the current passage and a region where the current confinement layer exists is in a range of $1.5 \times 10^{-3}$ to $7.0 \times 10^{-3}$;
   an upper second optical waveguide layer of the second conductive type formed so as to bury said opening, the upper second optical waveguide layer being formed on said current confinement layer;
   an upper cladding layer of the second conductive type, the upper cladding layer being formed on said upper second optical waveguide layer;
   a GaAs contact layer of the second conductive type, the GaAs contact layer being formed on said upper cladding layer;
   an electrode formed on said GaAs contact layer; and
   resonator facets formed of two opposite facets,
   wherein a current injection control structure that controls a current injection to said active layer is provided in the vicinity of at least one of said facets.

2. The semiconductor laser device according to claim 1, wherein said current injection control structure is formed by providing said GaAs contact layer to extend inwardly from a position away from said one facet by 5 ||m or more, and less than 20 μm.

3. The semiconductor laser device according to claim 1, wherein said current injection control structure is formed by providing said GaAs contact layer to extend inwardly from a position away from said one facet by 5 μm or more, and less than 20 μm, providing said electrode having a portion on said contact layer, the portion projecting to said facet from said contact layer, and providing an insulation layer between the projected portion of said electrode and said cladding layer of the second conductive type.

4. The semiconductor laser device according to any one of claims 1 to 3,
wherein said active layer is laminated only inwardly from a position away from at least one of said facets by a predetermined distance, and
a layer which has a band gap larger than that of said active layer, the layer being equivalent to said upper first optical waveguide layer, is laminated on a region ranging from an end edge away from said facet of said active layer to said facet.

5. A semiconductor laser device comprising:
a GaAs substrate of a first conductive type;
a lower cladding layer of said first conductive type, the lower cladding layer being formed on said GaAs substrate;
a lower optical waveguide layer of said first conductive type or an undoped type made of InGaP, the lower optical waveguide layer being lattice-matched with said GaAs substrate and formed on said lower cladding layer;
an active layer made of $In_{x1}Ga_{1-x1}As_{1-y1}P_{y1}$ with compressive strain where $0<x1\leq0.4$ and $0\leq y1\leq0.1$, the active layer being formed on said lower optical waveguide layer;
an upper first optical waveguide layer of a second conductive type or an undoped type made of InGaP, the upper first optical waveguide layer being lattice-matched with said GaAs substrate and formed on said active layer;
a current confinement layer made of $In_{0.49}(Al_{z2}Ga_{1-z2})_{0.51}P$ of a first conductive type, where $0.15\leq z2\leq1$, the current confinement layer having an opening serving as a current passage and being formed on said upper first optical waveguide layer, wherein an equivalent refractive index step difference between the opening serving as the current passage and a region where the current confinement layer exists is in a range of $1.5\times10^{-3}$ to $7.0\times10^{-3}$;
an upper second optical waveguide layer of the second conductive type formed so as to bury said opening, the upper second optical waveguide layer being formed on said current confinement layer;
an upper cladding layer of the second conductive type, the upper cladding layer being formed on said upper second optical waveguide layer;
a GaAs contact layer of the second conductive type, the GaAs contact layer being formed on said upper cladding layer;
an electrode formed on said GaAs contact layer; and
resonator facets formed of two opposite facets,
wherein said active layer is laminated only inwardly from a position away from at least one of said facets by a predetermined distance, and
a layer which has a band gap larger than that of said active layer, the layer being equivalent to said upper first optical waveguide layer, is laminated on a region ranging from an end edge of said active layer positioned away from said at least one of said facets to said at least one of said facets.

6. The semiconductor laser device according to either of claims 1 and 3, wherein each of said cladding layers is made of any one of $Al_{z1}Ga_{1-z1}As$ where $0.57\leq z1\leq0.8$ and $In_{0.49}(Ga_{1-z4}Al_{z4})_{0.51}P$, where $0.1\leq z4\leq0.5$.

7. The semiconductor laser device according to either of claims 1 and 5, wherein said upper second optical waveguide layer of the second conductive type is made of any one of InGaP and AlGaAs having a refractive index equivalent to that of said InGaP, which are lattice-matched with said GaAs substrate.

8. The semiconductor laser device according to either of claims 1 and 5, further comprising barrier layers with a thickness of 10 nm or less made of $In_{x3}Ga_{1-x3}As_{1-y3}P_{y3}$ where $0\leq x3\leq0.3$ and $0.1\leq y3\leq0.6$, said barrier layers being severally formed between said active layer and said lower optical waveguide layer and between said active layer and said upper first optical waveguide layer and having band gaps larger than that of said active layer.

9. The semiconductor laser device according to claim 8, further comprising a strain compensation layer made of $in_{x2}Ga_{1-x2}As_{1-y2}P_{y2}$ where $0\leq x2<0.49y2$ and $0\leq y2\leq0.5$, said strain compensation layer being formed between said active layer and said barrier layer, and having tensile strain stress.

10. The semiconductor laser device according to either of claims 1 and 5, wherein an oscillation peak wavelength is in a range from 900 to 1200 nm.

11. The semiconductor laser device according to either of claims 1 and 5, wherein a width of said current passage is 1.5 μm or more and less than 4 μm.

12. The semiconductor laser device according to either of claims 1 and 5, wherein a width of said current passage is 4 μm or more.

* * * * *